United States Patent [19] … [11] Patent Number: 5,929,702
Myers et al. … [45] Date of Patent: Jul. 27, 1999

[54] METHOD AND APPARATUS FOR HIGH EFFICIENCY HIGH DYNAMIC RANGE POWER AMPLIFICATION

[75] Inventors: Ronald Gene Myers, Scottsdale; Kenneth Vern Buer, Gilbert, both of Ariz.; Frederick H. Raab, Burlington, Vt.

[73] Assignee: Motorola, Inc., Schaumburg, Ill.

[21] Appl. No.: 08/980,435

[22] Filed: Nov. 28, 1997

[51] Int. Cl.⁶ .................................................. H03G 3/20
[52] U.S. Cl. ............................. 330/136; 330/10; 330/297
[58] Field of Search ............................. 330/10, 136, 202, 330/297; 332/149, 155

[56] References Cited

U.S. PATENT DOCUMENTS

| | | | |
|---|---|---|---|
| 4,218,660 | 8/1980 | Carver | 330/297 |
| 4,417,358 | 11/1983 | Zeis | 330/297 X |
| 4,831,334 | 5/1989 | Hudspeth et al. | 330/10 |
| 5,251,330 | 10/1993 | Chiba et al. | 455/91 |
| 5,777,519 | 7/1998 | Simopoulos | 330/297 |
| 5,825,248 | 10/1998 | Ozawa | 330/297 X |

OTHER PUBLICATIONS

An article entitled "High–Efficiency Single–Sideband HF/VHF Transmitter Based Upon Envelope Elimination And Restoration" by F.H. Raab and D.J. Rupp, Green Mountain Radio Research Company, USA from IEEE CP392, UK pp. 21–25, Jul. 4–7, 1994.

An article entitled "Class–S High–Efficiency Amplitude Modulator" by Dr. Frederick H. Raab and D.J. Rupp, Green Mountain Radio Research from GMRR TP93–1:RF Design, vol. 17, No. 5, pp. 70–74, May 1994.

An article entitled "Single–Sideband Transmission By Envelope Elimination and Restoration" by Leonard R. Kahn from Proceedings Of The IRE, Jul. 1952.

Primary Examiner—Robert Pascal
Assistant Examiner—Khanh Van Nguyen
Attorney, Agent, or Firm—Dana B. LeMoine

[57] ABSTRACT

A method and apparatus for efficient power amplification of a high dynamic range signal includes an envelope detector (220), a multi-range modulator (270), and a power amplifier (260). The multi-range modulator (270) efficiently amplifies the envelope of the input signal by selecting a power source as a function of the amplitude of the input signal. Multi-range modulator (200) produces a pulsewidth modulated signal with a duty cycle and an amplitude. When the amplitude of the input signal rises above a reference, the duty cycle and the amplitude are modified so as to keep the multi-range modulator in an operating region of high efficiency.

12 Claims, 3 Drawing Sheets

METHOD AND APPARATUS FOR HIGH EFFICIENCY HIGH DYNAMIC RANGE POWER AMPLIFICATION

FIELD OF THE INVENTION

This invention relates in general to power amplifiers and, in particular, to high efficiency, high dynamic range power amplifiers.

BACKGROUND OF THE INVENTION

Various apparatus are available for amplifying signals. In amplifier applications that involve the amplification and transmission of modulated signals, a premium is placed on amplifier efficiency. In addition, because many applications require a high dynamic range, a premium is placed on the ability to efficiently create a high fidelity reproduction of a signal with a widely varying amplitude.

Communications devices, which often transmit high dynamic range signals, are an example of an application where these qualities are in demand. High dynamic range allows the communications devices to communicate more reliably over a variety of distances, and high efficiency allows the devices to operate longer on a single battery.

One method of achieving increased efficiency is to use envelope elimination and restoration (EER)-type amplifiers. EER is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier which operates on the bandwidth of the RF envelope rather than the RF bandwidth. The phase modulated carrier in the phase path is then amplitude modulated by the amplified envelope signal, creating an amplified replica of the input signal.

In EER-type amplifiers the dynamic range is limited in part by the dynamic range of the class S modulator used to amplify the envelope. The class S modulator is a pulsewidth modulated system, so the maximum signal level that can be output is limited by the maximum duty cycle of the pulse-width modulator. In addition, the dynamic range is limited by the minimum duty cycle. It would be desirable to have a method and apparatus which increases the dynamic range beyond that possible with a class S modulator.

In addition, the efficiency of class S modulators decreases for small signal levels. In class S modulators, a drive power is necessary to operate power devices that create an amplified pulsewidth modulated signal, and when the duty cycle is small, the drive power is a large percentage of the total power consumed. It would be desirable to have a method and apparatus for increasing the efficiency of a pulsewidth modulated system for small signal levels.

Accordingly, a need exists for a power amplifier that efficiently amplifies a RF signal exhibiting a high dynamic range.

DETAILED DESCRIPTION OF THE DRAWINGS

Figure 1:
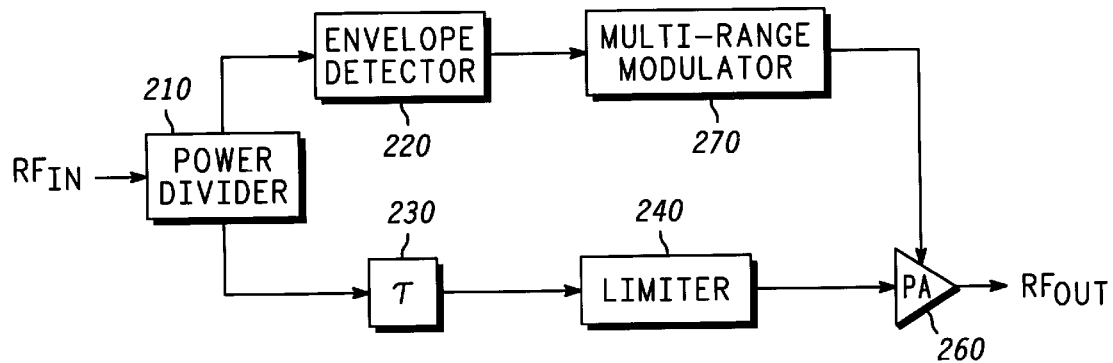
FIG. 1 shows a diagram of an amplifier in accordance with a preferred embodiment of the present invention.

FIG. 1 shows a diagram of an amplifier in accordance with a preferred embodiment of the present invention. EER-type amplifier 10 includes power divider 210, envelope detector 220, multi-range modulator 270, time delay element 230, limiter 240, and power amplifier 260. EER-type amplifier 10 receives an RF input into power divider 210. Power divider 210 splits the RF input signal into an amplitude path which feeds envelope detector 220, and a phase path which feeds time delay element 230.

The phase path of EER-type amplifier 10 includes time delay element 230, limiter 240 and power amplifier 260. Time delay element 230, which produces a delay equal to that introduced by multi-range modulator 270 in the amplitude path, receives an output from power divider 210. Limiter 240 receives the time delayed signal output from time delay element 230, and amplitude limits the signal. Limiter 240 can be omitted, or it can perform soft limiting, but limiter 240 preferably performs hard limiting so that the output of limiter 240 includes phase information with little or no amplitude information. After limiting, with the amplitude information removed, the resultant signal is the phase modulated carrier. The phase modulated carrier output from limiter 240 is input to power amplifier 260. Power amplifier 260 is any amplifier stage capable of being modulated, and it is preferably a field effect transistor (FET) amplifier. The drain of the FET is conventionally connected to a DC power source; however, as will be discussed below, in a preferred embodiment exemplified herein, the drain of the FET is driven with a signal, resulting in an amplitude modulated output signal.

In a preferred embodiment, time delay element 230 is used in the phase path because it is desirable to recombine the signals from the amplitude path and the phase path after each has been subjected to substantially equal delays. The absolute delay of time delay element 230 is such that the total delay in the phase path is substantially equal to the total delay in the amplitude path. Time delay element 230 is shown as the first element in the phase path; however, the actual placement of time delay element 230 within the phase path is not a limitation of the present invention. Because the function of time delay element 230 is to balance the delays in the phase path and the amplitude path, the actual position of time delay element 230 in the phase path is not important.

Alternate embodiments of the present invention substantially match the delay in the two paths using circuit arrangements other than the one using time delay element 230 alone. In a first alternate embodiment, multiple delay lines, one in each of the phase path and amplitude path are used. In this case, the absolute delay of any one delay line assumes less importance, and the differential delay between the two delay lines is used to match the delays in the two paths. In another alternate embodiment, a differential delay line, such as a surface acoustic wave (SAW) delay line, with one input and multiple outputs is used as a combination of power divider 210 and time delay element 230. In this alternate embodiment, as in the first alternate embodiment, the differential delay is used to match the delay in the two paths.

The amplitude path of EER-type amplifier 10 includes envelope detector 220 and multi-range modulator 270. Envelope detector 220 detects the envelope of the RF input signal and outputs an envelope signal which represents the amplitude information included in the original RF input signal. Envelope detector 220 is preferably a diode detector; however, other types of detectors, such as a synchronous detector based upon a double balanced mixer, could be used.

Multi-range modulator 270 amplifies the envelope signal output from envelope detector 220 and drives the drain bias of power amplifier 260. Multi-range modulator 270 amplifies the envelope signal to a level commensurate with the desired output. The output of multi-range modulator 270 is the power supply for power amplifier 260, and the resultant remodulation of the phase modulated carrier restores the envelope, producing an amplified replica of the input signal.

Multi-range modulator 270 is an amplifier that uses at least one of multiple power sources. The choice as to which power source to use is made as a function of the amplitude of the envelope signal. By selecting the appropriate power source as a function of input signal level, multi-range modulator 270 operates with a higher average efficiency.

The EER-type amplifier of FIG. 1 varies the drain bias of power amplifier 260 in such a way as to maintain operation near saturation and therefore in a region of high efficiency. Because the highly efficient power amplifier 260 consumes the majority of the power consumed in EER-type amplifier 10, the entire circuit is considerably more efficient than conventional amplifiers.

Figure 2:
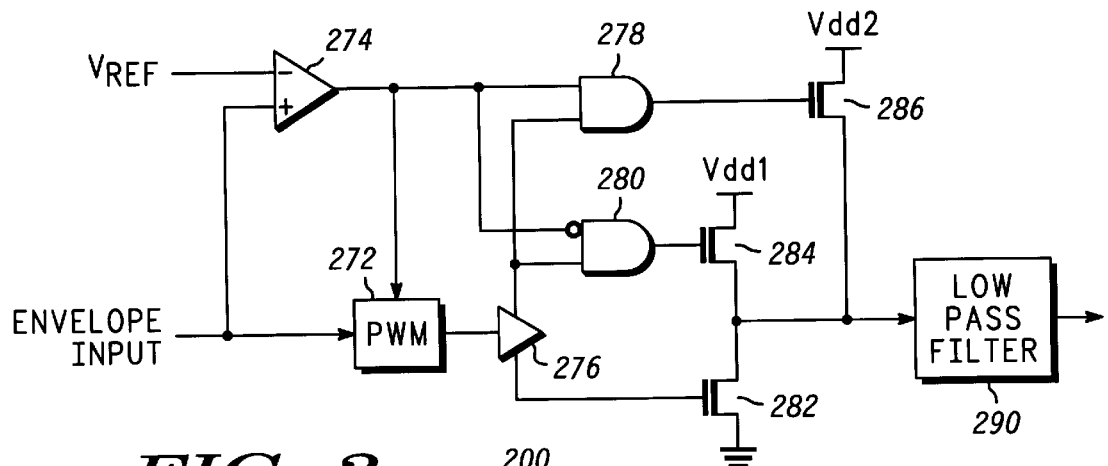
FIG. 2 shows a diagram of a multi-range modulator in accordance with a preferred embodiment of the present invention.

FIG. 2 shows a diagram of a multi-range modulator in accordance with a preferred embodiment of the present invention. Multi-range modulator 200 includes pulsewidth modulator (PWM) 272, reference comparator 274, logic gates 278 and 280, driver 276, switching transistors 282, 284, and 286, and low pass filter 290. An envelope signal is input to multi-range modulator 200 at PWM 272 and reference comparator 274. Reference comparator 274 can be one of many devices capable of comparing two signals, but is preferably an operational amplifier.

The operation of multi-range modulator 200 differs based on whether the amplitude of the envelope signal is below or above the reference voltage shown as Vref in FIG. 2. When the amplitude of the envelope signal is below Vref, multi-range modulator 200 operates in a first mode. When the amplitude of the envelope signal is above Vref, multi-range modulator 200 operates in a second mode. Multi-range modulator 200 changes from the first mode of operation to the second as the amplitude of the envelope signal increases, and changes from the second mode of operation to the first as the amplitude of the envelope signal decreases. The first mode of operation of multi-range modulator 200 will now be described.

When the envelope signal is below the reference voltage, the output of reference comparator 274 is low. With the output of reference comparator 274 in a low state, logic gate 278 is disabled and logic gate 280 is enabled. PWM 272 outputs a pulsewidth modulated waveform which has a duty cycle proportional to the amplitude of the envelope signal. Driver 276 accepts the pulsewidth modulated signal from PWM 272, and drives switching transistor 282 and logic gates 278 and 280. In the first mode of operation, logic gate 278 is disabled because the output of reference comparator 274 is low. As a result, switching transistor 286 does not come on. Instead, switching transistors 284 and 282 alternately turn on as a function of the duty cycle of the pulsewidth modulated signal.

When the pulsewidth modulated signal is high, switching transistor 284 is on, thereby presenting a voltage substantially equal to Vdd1 at low pass filter 290. Conversely, when the pulsewidth modulated signal is low, switching transistor 284 is off and switching transistor 282 is on. This discharges the node at the input to low pass filter 290, thereby bringing it close to ground potential. Low pass filter 290 filters the resulting amplified pulsewidth modulated signal, suppressing the switching frequency of the pulsewidth modulator, and producing an amplified replica of the envelope signal. The operation of multi-range modulator 200 described thus far is that of a class S modulator with a power source of Vdd1. This mode of operation will be maintained so long as the envelope signal has an amplitude less than Vref.

When the amplitude of the envelope signal increases beyond Vref, multi-range modulator 200 transitions from the first mode of operation to the second mode of operation. The output of reference comparator 274 changes state and becomes high. The high output of reference comparator 274 disables logic gate 280 and enables logic gate 278. With the output of reference comparator 274 high, switching transistors 286 and 282 alternately turn on as a function of the duty cycle of the pulsewidth modulated signal. When the pulsewidth modulated signal is high, switching transistor 286 turns on and supplies a voltage substantially equal to Vdd2 to the input of low pass filter 290. This is in contrast to the first mode of operation where switching transistor 284 came on and supplied a voltage substantially equal to Vdd1 to the input of low pass filter 290. Vdd1 and Vdd2 can have any relationship, but for exemplary purposes, Vdd2 is assumed to be twice the voltage of Vdd1. Vref is preferably determined so that the operation of multi-range modulator 200 will switch from Vdd1 to Vdd2 as the pulsewidth modulated signal approaches a duty cycle of one hundred percent. The output of reference comparator 274 is input to PWM 272 so that PWM 272 receives an indication when operation switches from Vdd1 to Vdd2.

Switching transistor 286 has a higher current handling requirement than switching transistor 284 because switching transistor 286 is connected to a larger power supply, namely Vdd2. In general, transistors that have a higher current handling capability have larger physical dimensions, and the larger physical dimensions, in turn, cause increased capacitance at the driving input. The increased capacitance is seen by the driving device, which causes more power to be dissipated as the transistor is turned on off. For example, gate 278 has to deliver more current to turn on transistor 286 than gate 280 has to deliver to turn on transistor 284. By switching operation from switching transistor 286 to switching transistor 284 for small signal levels, drive power is saved and overall efficiency improves.

Multi-range modulator 200 includes a single switching transistor coupled to ground for discharging the input to low pass filter 290. Switching transistor 282 is selected to handle the largest foreseeable current, and so is sized in accordance with the current handling requirements of switching transistor 286. In an alternate embodiment, multiple switching transistors couple the input of low pass filter 290 to ground, and the transistors are sized to handle the different amounts of current as required by the available supply voltages. In operation, the additional switching transistors are selected by the use of gates analogous to gates 278 and 280, and so the drive power necessary to operate the transistors is reduced based on input signal level. In the alternate embodiment just described, the efficiency is further improved at low signal levels.

Multi-range modulator 200 has been described with two voltages, Vdd1 and Vdd2, and a single reference comparator 274 and an associated reference voltage. This yields two modes of operation and two corresponding operating ranges for multi-range modulator 200, namely those set by Vdd1 and Vdd2. In an alternate embodiment, more than two ranges are contemplated. Multi-range modulator 200 can be scaled to use any number of supply voltage values beyond those of Vdd1 and Vdd2 as shown in FIG. 2. In support of the additional ranges, multiple reference comparators and logic gates are contemplated.

Multi-range modulator 200 has a delay associated with its operation as a whole. When multi-range modulator 200 is used in an EER-type amplifier to amplify the envelope of a signal, the delay of multi-range modulator 200 is compensated for by time delay means in the EER-type amplifier. For example, in the EER-type amplifier embodiment of FIG. 1, the delay of multi-range modulator 200 is compensated for by time delay element 230.

Figure 3:
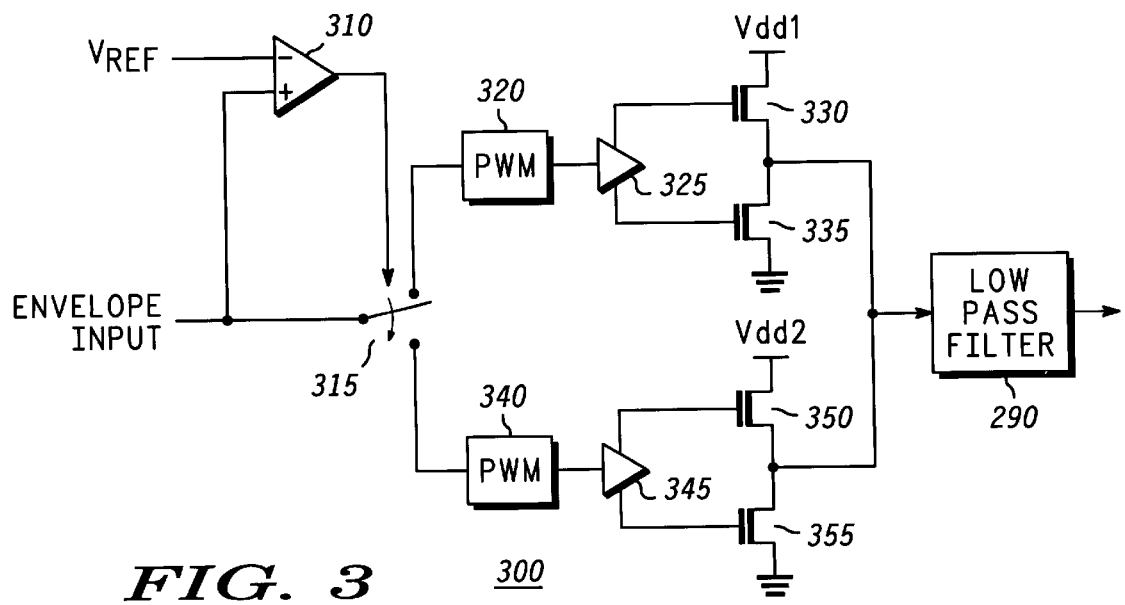
FIG. 3 shows a diagram of a multi-range modulator in accordance with an alternate embodiment of the present invention.

FIG. 3 shows a diagram of a multi-range modulator in accordance with a preferred embodiment of the present invention. Multi-range modulator 300 includes reference comparator 310, switch 315, pulsewidth modulators (PWM) 320 and 340, drivers 325 and 345, switching transistors 330, 335, 350, and 355, and low pass filter 290. An envelope signal is input to multi-range modulator 300 at switch 315 and reference comparator 310. Reference comparator 310 can be one of many devices capable of comparing two signals, but is preferably an operational amplifier. The operation of multi-range modulator 300 differs based on whether the amplitude of the envelope signal is below or above the reference voltage shown as Vref in FIG. 3. When the amplitude of the envelope signal is below Vref, multi-range modulator 300 operates in a first mode. When the amplitude of the envelope signal is above Vref, multi-range modulator 300 operates in a second mode. Multi-range modulator 300 changes from the first mode of operation to the second as the amplitude of the envelope signal increases, and changes from the second mode of operation to the first as the amplitude of the envelope signal decreases. The first mode of operation of multi-range modulator 300 will now be described.

When the envelope signal is below the reference voltage, the output of reference comparator 310 is low. With the output of reference comparator 310 in a low state, switch 315 routes the envelope signal to PWM 320. PWM 320 outputs a pulsewidth modulated waveform which has a duty cycle proportional to the amplitude of the envelope signal. Driver 325 accepts the pulsewidth modulated signal from PWM 320, and drives switching transistors 330 and 335. Switching transistors 330 and 335 alternately turn on as a function of the duty cycle of the pulsewidth modulated signal. When the pulsewidth modulated signal is high, switching transistor 330 is on, thereby presenting a voltage substantially equal to Vdd1 at low pass filter 290. Conversely, when the pulsewidth modulated signal is low, switching transistor 330 is off and switching transistor 335 is on. This discharges the node at the input to low pass filter 290, thereby bringing it close to ground potential. Low pass filter 290 filters the resulting amplified pulsewidth modulated signal, suppressing the switching frequency of the pulsewidth modulator, and producing an amplified replica of the envelope signal. The operation of multi-range modulator 300 described thus far is that of a class S modulator with a power source of Vdd1. This mode of operation will be maintained so long as the envelope signal has an amplitude less than Vref.

When the amplitude of the envelope signal increases beyond Vref, multi-range modulator 300 transitions from the first mode of operation to the second mode of operation. The output of reference comparator 310 changes state and becomes high. The high output of reference comparator 310 causes switch 315 to route the envelope signal to PWM 340 instead of PWM 320. PWM 340 outputs a pulsewidth modulated waveform which has a duty cycle proportional to the amplitude of the envelope signal, where the constant of proportionality is smaller than that of PWM 320. The constants of proportionality for PWM 320 and PWM 340 are related to the ratio of the supply voltages, Vdd1 and Vdd2, as is explained in further detail below.

Driver 345 accepts the pulsewidth modulated signal from PWM 340, and drives switching transistors 350 and 355. Switching transistors 350 and 355 alternately turn on as a function of the duty cycle of the pulsewidth modulated signal. When the pulsewidth modulated signal is high, switching transistor 350 is on, thereby presenting a voltage substantially equal to Vdd2 at low pass filter 290. Conversely, when the pulsewidth modulated signal is low, switching transistor 350 is off and switching transistor 355 is on. This discharges the node at the input to low pass filter 290, thereby bringing it close to ground potential. Low pass filter 290 filters the resulting amplified pulsewidth modulated signal, suppressing the switching frequency of the pulsewidth modulator, and producing an amplified replica of the envelope signal.

The second mode of operation just described is in contrast to the first mode of operation where switching transistor 330 came on and supplied a voltage substantially equal to Vdd1 to the input of low pass filter 290. Vdd1 and Vdd2 can have any relationship, but for exemplary purposes, Vdd2 is assumed to be twice the voltage of Vdd1. Vref is preferably determined so that the operation multi-range modulator 300 will switch from Vdd1 to Vdd2 as the pulsewidth modulated signal approaches a duty cycle of one hundred percent. The switch from the first mode to the second mode is described more fully with reference to the next figure.

Switch 315 functions to select a pulsewidth modulator for operation based on the amplitude of the envelope signal. In an alternate embodiment, the function of switch 315 is embedded in each pulsewidth modulator. In this embodiment, the envelope signal is routed to both pulsewidth modulators. The output of reference comparator 310 is also routed to both pulsewidth modulators. The output of reference comparator 310 selects which pulsewidth modulator is used. When it is low, PWM 320 is on, and when it is high, PWM 340 is on. Other methods of selecting a pulsewidth modulator for operation are contemplated, including each pulsewidth modulator receiving a separate reference voltage for internal comparison purposes.

Multi-range modulator 300 has been described with two voltages, Vdd1 and Vdd2, and a single reference comparator 310 and an associated reference voltage. This yields two modes of operation and two corresponding operating ranges for multi-range modulator 300, namely those set by Vdd1 and Vdd2. In an alternate embodiment, more than two ranges are contemplated. Multi-range modulator 300 can be scaled to use any number of supply voltage values beyond those of Vdd1 and Vdd2 as shown in FIG. 3. In support of the additional ranges, multiple reference comparators, pulse-width modulators with different constants of proportionality, drivers, and switching transistors are contemplated.

Multi-range modulators 200 (FIG. 2) and 300 have been described as two separate embodiments; however, one skilled in the art will appreciate that multiple alternate embodiments are derived when combining the specific embodiments described. For example, a single pulsewidth modulator can be used in multi-range modulator 300 along with logic gates to select which pair of switching transistors to drive.

Multi-range modulator 300 has two separate pairs of switching transistors, one pair for each supply, whereas multi-range modulator 200 (FIG. 2) has separate switching transistors coupled to each supply, but shares a common switching transistor coupled to ground. As previously stated, multi-range modulator 200 (FIG. 2) is efficient at low signal levels in part because of the advantageous sizing of the switching transistors. Multi-range modulator 300, by not sharing a switching transistor coupled to ground, and by having two separate pairs of switching transistors, further increases efficiency. In multi-range modulator 300 both transistors of a given pair are sized such that they require the minimum amount of current to turn on.

Figure 4:
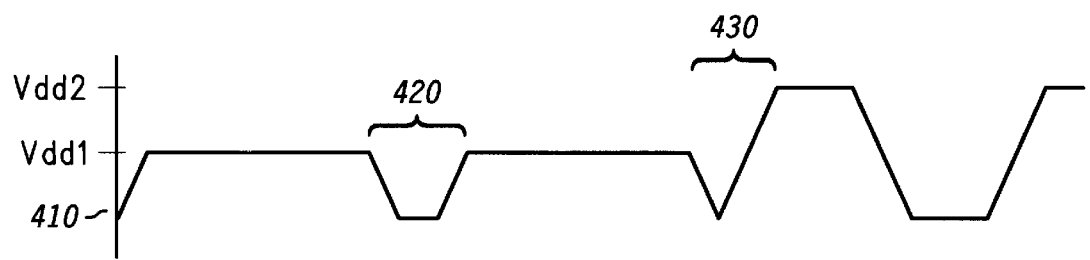
FIG. 4 shows a switching waveform in accordance with a preferred embodiment of the present invention.

FIG. 4 shows a switching waveform in accordance with a preferred embodiment of the present invention. FIG. 4 shows switching waveform 410 which includes regions 420, 430 and 440. Switching waveform 410 is a pulsewidth modulated signal produced in response to an envelope signal which is increasing in amplitude. Switching waveform 410 represents an exemplary signal at the input to low pass filter 290 (FIGS. 2 and 3). The remaining discussion of FIG. 4 references multi-range modulator 200 (FIG. 2), but it will be appreciated that the discussion of waveform 410 is also applicable to other multi-range modulator embodiments, including that of multi-range modulator 300 as shown in FIG. 3.

In switching waveform 410, as the duty cycle increases to near one hundred percent, the finite rise and fall times of the waveform begin to overlap as shown in regions 420 and 430. In region 420 the rise and fall times of the waveforms do not yet overlap, but in region 430 the duty cycle has increased to the point where overlap is beginning. If the duty cycle were allowed to increase beyond this point, then the rise and fall times would increasingly overlap causing distortion at the output. This causes nonlinearities at high signal output levels, and reduces the useable dynamic range of the modulator.

As the duty cycle approaches one hundred percent, as shown by region 430, it is desirable to increase the amplitude of the pulsewidth modulated waveform so that the duty cycle can be reduced. In a preferred embodiment, as the duty cycle approaches one hundred percent, the amplitude of the envelope signal increases beyond that of Vref, causing reference comparator 274 (FIG. 1) to change state. When this occurs, multi-range modulator 200 (FIG. 2) switches from the first range to the second range. This is shown in FIG. 4 at region 430. In the second range, the input to the low pass filter switches between ground and Vdd2 instead of between ground and Vdd1. In addition, PWM 272 (FIG. 2) cuts the duty cycle in half. The duty cycle is cut in half because in the exemplary multi-range modulator set forth in FIG. 2, Vdd2 is twice Vdd1.

In the exemplary embodiment of FIG. 2, when the input signal is below the reference, a pulsewidth modulated signal is produced that has an amplitude Vdd1 and a duty cycle kA, where k is a proportionality constant and A is the amplitude of the input signal. When the input signal is above the reference, a pulsewidth modulated signal is produced that has an amplitude Vdd2 and a duty cycle jA, where j is a constant of proportionality less than k. More simply stated, when the amplitude of the input signal increases beyond a reference, the duty cycle of the pulsewidth modulated signal decreases and the amplitude of the pulsewidth modulated signal increases.

In a switching modulator exemplified by multi-range modulator 200 (FIG. 2), efficiency is generally greater for larger duty cycles. It is desirable, therefore, to maintain operation with as high a duty cycle as possible. By adding additional ranges, switching waveforms can be maintained at consistently large duty cycles. Additional ranges are added by adding additional reference comparators, transistors, and logic gates. Operating voltages can be chosen so that when a reference voltage is surpassed, the duty cycle will decrease not by a factor of two as shown in switching waveform 410, but by some lesser amount. This provides the dual advantage of increasing the dynamic range and increasing the efficiency.

Figure 5:
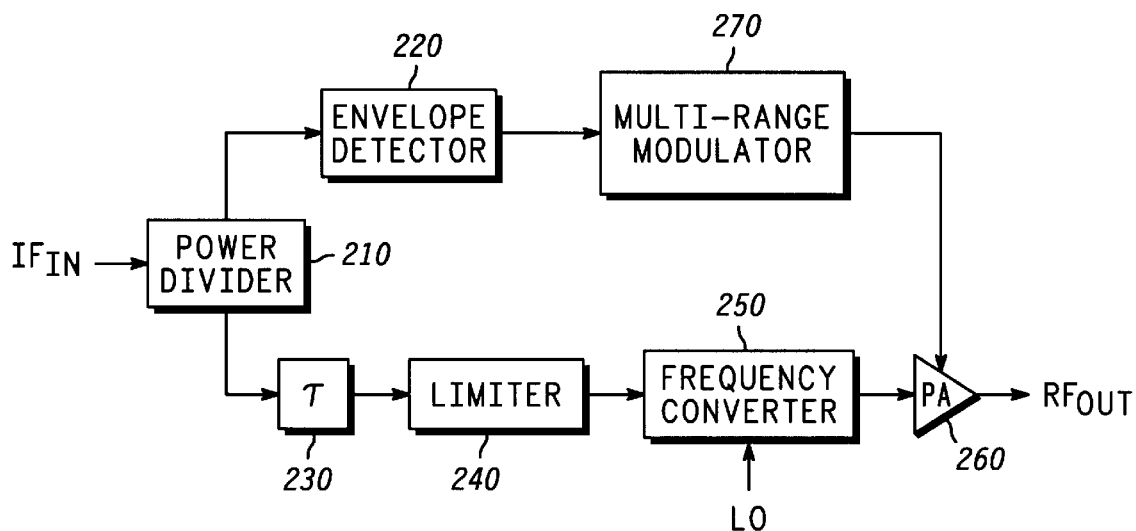
FIG. 5 shows an amplifier in accordance with an alternate embodiment of the present invention.

FIG. 5 shows an amplifier in accordance with an alternate embodiment of the present invention. In FIG. 5 an intermediate frequency (IF) signal is shown as the input signal to EER-type amplifier 20. The IF signal is input into power divider 210. Power divider 210 functions to split the input signal into the amplitude path and the phase path. The amplitude path feeds envelope detector 220, and the phase path feeds time delay element 230.

The amplitude path of EER-type amplifier 20 includes envelope detector 220 and multi-range modulator 270. These elements correspond to the elements of FIG. 1 which have like names and like reference numbers. In addition, multi-range modulator 270 corresponds to multi-range modulator 270 of FIG. 1, embodiments of which were discussed in detail previously in connection with FIGS. 2–4.

The phase path of EER-type amplifier 20 includes time delay element 230, limiter 240, frequency converter 250 and power amplifier 260. Time delay element 230, limiter 240 and power amplifier 260 correspond to the elements shown in FIG. 1 with like names and like reference numbers. In contrast to the embodiment shown in FIG. 1, the alternate embodiment of FIG. 5 includes frequency converter 250 in the phase path. Frequency converter 250 receives the signal in the phase path and also receives a local oscillator (LO) signal. Frequency converter 250 converts the frequency of the carrier signal to its final RF frequency using circuits well known in the art, such as a mixer. The resulting signal is then used to drive power amplifier 260 which operates at the final RF frequency.

Because of the operation of frequency converter 250, the amplifier of FIG. 5 takes in a signal at a frequency different from the final RF frequency. FIG. 5 shows an IF signal input to EER-type amplifier 20. The IF input signal can be above or below the resultant RF frequency. In addition, one skilled in the art will understand that a baseband signal could also be used. Therefore, in the alternate embodiment exemplified in FIG. 5, the input signal can be at any frequency different from the RF frequency.

Figure 6:
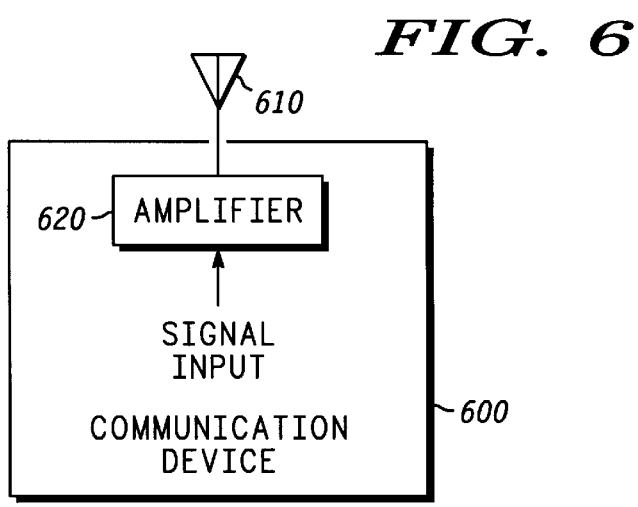
FIG. 6 shows a diagram of a communications device in accordance with a preferred embodiment of the present invention.

FIG. 6 shows a diagram of a communications device in accordance with a preferred embodiment of the present invention. Communications device 600 includes amplifier 620 and antenna 610. Amplifier 620 may comprise any of the amplifiers of the present invention, including for example, EER-type amplifier 10 (FIG. 1), multi-range modulator 200 (FIG. 2), multi-range modulator 300 (FIG. 3), or EER-type amplifier 20 (FIG. 5). Communications device 600 may be one of many different devices capable of communications. Examples include, but are not limited to, subscriber units in a communications system, radio receivers, transmitters, and transceivers, one-way and two-way pagers, and cellular phones.

Figure 7:
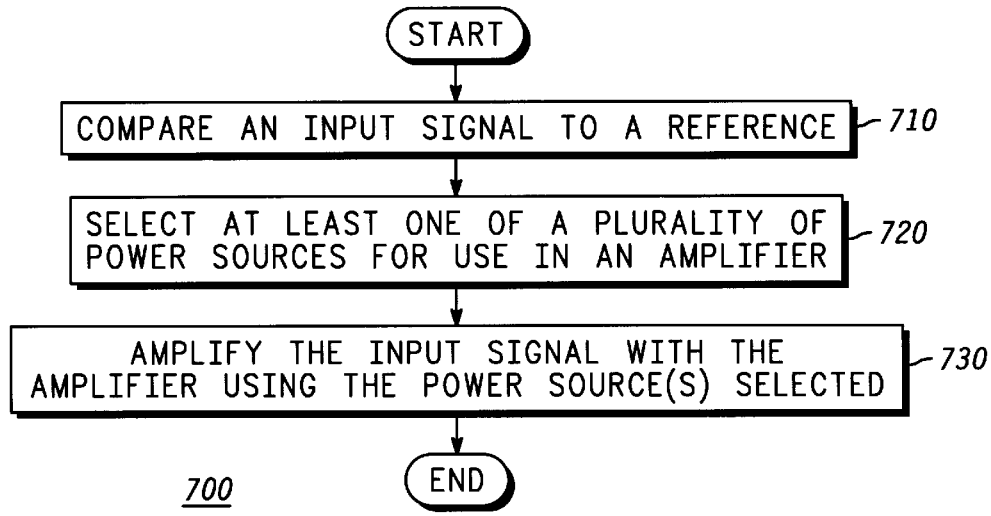
FIG. 7 shows a flow chart for a method of amplifying a signal in accordance with a preferred embodiment of the present invention.

FIG. 7 shows a flowchart for a method of amplifying a signal in accordance with a preferred embodiment of the present invention. Method 700 begins with step 710 when an input signal is compared to a reference. Then in step 720, as a result of the comparison in step 710, at least one of a plurality of power sources is selected for use in an amplifier. Then in step 730, the input signal is amplified with the amplifier that uses the power sources selected.

Method 700 as shown in FIG. 7 is a method which selects a power source to be used in an amplifier where the selection is a function of the amplitude of the input signal. This allows an amplifier to be operated in a more efficient range because a power source can be chosen close to the amplitude of the input signal.

Figure 8:
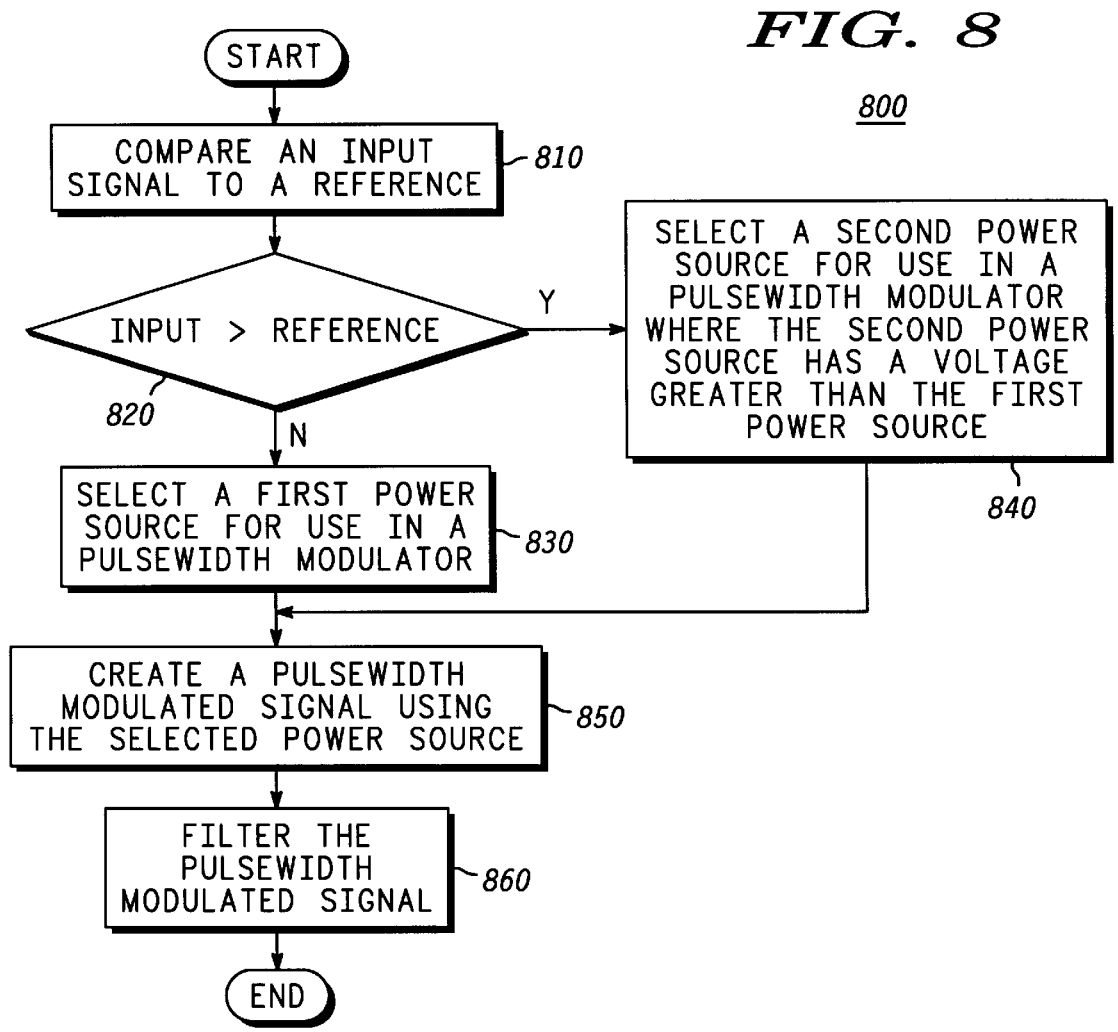
FIG. 8 shows a flow chart for a method of amplifying a signal in accordance with a preferred embodiment of the present invention.

FIG. 8 shows a flowchart for a method of amplifying a signal in accordance with a preferred embodiment of the present invention. Method 800 begins with step 810 when an input signal is compared to a reference. If in step 820 the input is found to be less than the reference, processing proceeds to step 830. Otherwise processing proceeds to step 840. In step 830 a first power source is selected for use in a pulsewidth modulator. In step 840 a second power source is selected for use in a pulsewidth modulator, where the second power source has a voltage greater than the first power source selected in step 830. After either step 830 or 840, processing proceeds with step 850. In step 850 a pulsewidth modulated signal is created using the selected power source. That is, if the input is less than the reference, the first power source selected in step 830 is used. Conversely, if the input is greater than the reference, the second power source selected in step 840 is used. After step 850 processing proceeds to step 860 where the pulsewidth modulated signal is low pass filtered. The result is an amplified version of the input signal.

In summary, the method and apparatus of the present invention as described is a versatile way of achieving efficient amplification of a signal with a high dynamic range. In addition, the method and apparatus provides for increased efficiency for small signal levels. Embodiments of an EER-type amplifier which utilizes a multi-range modulator have been described. The multi-range modulator efficiently amplifies a high dynamic range envelope and allows the EER-type amplifier to efficiently amplify a high dynamic range RF signal.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, power amplifier 260 could be comprised of multiple stages.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of amplifying an input signal, said method comprising the steps of:

comparing said input signal to at least one reference;

responsive to said comparing step, selecting at least one power source for an amplifier;

producing a pulsewidth modulated signal with a duty cycle proportional to an amplitude of said input signal;

amplifying said pulsewidth modulated signal with said amplifier, thereby producing an amplified pulsewidth modulated signal; and filtering said amplified pulsewidth modulated signal, thereby producing an amplified replica of the input signal.

2. The method of claim 1 wherein said step of producing a pulsewidth modulated signal comprises the steps of:

when said input signal is below a first of said at least one reference, producing a pulsewidth modulated signal having a first duty cycle of kA, where A is the amplitude of the input signal, and k is a first constant of proportionality; and when said input signal is above said first of said at least one reference, producing said pulsewidth modulated signal having a second duty cycle of jA, where A is the amplitude of the input signal, and j is a second constant of proportionality, where j is less than k.

3. An apparatus for amplifying signals, said apparatus comprising:

at least one reference comparator for comparing an input signal to at least one reference, and for producing at least one comparison signal;

a first pulsewidth modulator having an input responsive to said input signal, and an output upon which is produced a pulsewidth modulated signal having a duty cycle substantially proportional to an amplitude of said input signal;

a filter having an output coupled to an output of said apparatus, and an input;

a first switching transistor coupled between the input of the filter, a reference potential, and the output of the first pulsewidth modulator, wherein responsive to the pulsewidth modulated signal, the first switching transistor alternately presents a high impedance and the reference potential to the input of the filter; and a plurality of second switching transistors, each operatively coupling a separate power supply to the input of the filter responsive to the at least one comparison signal and responsive to the output of the pulsewidth modulator;

wherein responsive to the at least one comparison signal, one of the plurality of second switching transistors is selected to operate complementary to the first switching transistor.

4. The apparatus of claim 3 wherein said at least one reference comparator comprises an operational amplifier.

5. The apparatus of claim 3 wherein the first pulsewidth modulator is further responsive to the at least one comparison signal and wherein:

when said at least one comparison signal is in a first state, the duty cycle of the pulsewidth modulated signal produced by said first pulsewidth modulator is substantially equal to kA, where A is the amplitude of the input signal and k is a first constant of proportionality; and when said at least one comparison signal is in a second state, the duty cycle of the pulsewidth modulated signal produced by said first pulsewidth modulator is substantially equal to jA, where A is the amplitude of the input signal and j is a second constant of proportionality, where j is not equal to k.

6. An apparatus for amplifying signals, said apparatus comprising:

reference comparison means for comparing an input signal to at least one reference;

responsive to said reference comparison means, power source selection means for selection of at least one power source;

pulsewidth modulation means for producing a pulsewidth modulated signal having a duty cycle substantially proportional to an amplitude of said input signal;

amplifying means, responsive to said at least one power source, for amplifying said pulsewidth modulated signal, thereby producing an amplified pulsewidth modulated signal; and filter means responsive to said amplifying means, for filtering said amplified pulsewidth modulated signal, thereby producing an amplified replica of the input signal.

7. The apparatus of claim 6 wherein said reference comparison means comprises an operational amplifier.

8. The apparatus of claim 6 wherein said amplifying means comprises:

a switching transistor coupled between said pulsewidth modulation means and said filter means.

9. An apparatus for amplifying an input signal, said apparatus comprising:

a power amplifier stage for amplifying said input signal, said power amplifier stage having a modulating input;

an envelope detector for detecting an envelope of said input signal; and a multi-range modulator for amplifying said envelope of said input signal, said multi-range modulator having an output which drives said modulating input of said power amplifier stage wherein said multi-range modulator comprises:

at least one reference comparator for comparing the envelope of the input signal to at least one reference, and for producing at least one comparison signal;

a first pulsewidth modulator having an input responsive to the envelope of the input signal, and an output upon which is produced a pulsewidth modulated signal having a duty cycle substantially proportional to the envelope of the input signal;

a filter having an output coupled to the output of said multi-range modulator, and an input;

a first switching transistor coupled between the input of the filter, a reference potential, and the output of the first pulsewidth modulator, wherein responsive to the pulsewidth modulated signal, the first switching transistor alternately presents a high impedance and the reference potential to the input of the filter; and a plurality of second switching transistors, each operatively coupling a separate power supply to the input of the filter responsive to the at least one comparison signal and responsive to the output of the pulsewidth modulator;

wherein responsive to the at least one comparison signal, one of the plurality of second switching transistors is selected to operate complementary to the first switching transistor.

10. An apparatus for amplifying an input signal, said apparatus comprising:

a reference comparator for comparing the input signal to a reference, and for producing a comparison signal;

a switch, responsive to the comparison signal, for routing the input signal to a first switch output or to a second switch output;

a first pulsewidth modulator having an input coupled to the first switch output, and having an output;

a second pulsewidth modulator having an input coupled to the second switch output, and having an output; and a filter having an output coupled an output of the apparatus, and having an input coupled to the output of the first pulsewidth modulator and to the output of the second pulsewidth modulator;

wherein when the comparison signal signifies the input signal is less than the reference, the input signal is routed to the first pulsewidth modulator, and when the comparison signal signifies the input signal is greater than the reference, the input signal is routed to the second pulsewidth modulator.

11. The apparatus of claim 10 further comprising:

a first amplifier powered by a first supply voltage, said first amplifier being coupled between the output of the first pulsewidth modulator and the input of the filter, the first amplifier, when driven, producing a first amplified pulsewidth modulated signal which transitions between substantially the first supply voltage and a reference potential; and a second amplifier powered by a second supply voltage, said second amplifier being coupled between the output of the second pulsewidth modulator and the input of the filter, the second amplifier, when driven, producing a second amplified pulsewidth modulated signal which transitions between substantially the second supply voltage and the reference potential;

wherein the first supply voltage is less than the second supply voltage.

12. The apparatus of claim 11 wherein:

a duty cycle of the first amplified pulsewidth modulated signal bears a relationship to the input signal of kA, where A is an amplitude of the input signal, and k is a first constant of proportionality; and a duty cycle of the second amplified pulsewidth modulated signal bears a relationship to the input signal of jA, where A is the amplitude of the input signal, and j is a second constant of proportionality, where j is less than k.

* * * * *